(12) United States Patent
Lin et al.

(10) Patent No.: US 8,227,890 B2
(45) Date of Patent: Jul. 24, 2012

(54) METHOD OF FORMING AN ELECTRICAL FUSE AND A METAL GATE TRANSISTOR AND THE RELATED ELECTRICAL FUSE

(75) Inventors: Yung-Chang Lin, Taichung (TW); Kuei-Sheng Wu, Tainan (TW); Chang-Chien Wong, Tainan (TW)

(73) Assignee: United Microelectronics Corporation, Hsinchu (TW)

( * ) Notice: Subject to any disclaimer, the term of this patent is extended or adjusted under 35 U.S.C. 154(b) by 187 days.

(21) Appl. No.: 12/641,322

(22) Filed: Dec. 18, 2009

(65) Prior Publication Data

US 2011/0147853 A1 Jun. 23, 2011

(51) Int. Cl.
*H01L 29/00* (2006.01)
(52) U.S. Cl. .................. 257/529; 257/530; 257/E23.147
(58) Field of Classification Search .................. 257/209, 257/529, 530, E23.147, E23.149
See application file for complete search history.

(56) References Cited

U.S. PATENT DOCUMENTS

| | | | |
|---|---|---|---|
| 2004/0188800 A1* | 9/2004 | Trivedi | 257/530 |
| 2008/0265366 A1* | 10/2008 | Guo et al. | 257/529 |
| 2010/0213569 A1* | 8/2010 | Wu et al. | 257/529 |
| 2011/0074538 A1* | 3/2011 | Wu et al. | 337/187 |
| 2011/0117710 A1 | 5/2011 | Lin et al. | |

OTHER PUBLICATIONS

Author: H. Takaoka, T. Ueda, H. Tsuda, and A. Ono (NEC Electronics Corporation,Japan) Title: A Novel Via-fuse Technology Featuring Highly Stable Blow Operation with Large On-off Ratio for 32nm Node and Beyond Date/pages/volume-issue No. 2007/Total 4 pages/ 1-4244-0439-X/07 from IEEE Xplore.

* cited by examiner

*Primary Examiner* — Hoai V Pham
(74) *Attorney, Agent, or Firm* — Chun-Ming Shih

(57) ABSTRACT

The present invention provides a method of integrating an electrical fuse process into a high-k/metal gate process. The method simultaneously forms a dummy gate stack of a transistor and a dummy gate stack of an e-fuse; and simultaneously removes the polysilicon of the dummy gate stack in the transistor region and the polysilicon of the dummy gate stack in the e-fuse region. Thereafter, the work function metal layer disposed in the opening of the e-fuse region is removed; and the opening in the transistor region and the opening in the e-fuse region with metal conductive structures are filled to form an e-fuse and a metal gate of a transistor.

7 Claims, 9 Drawing Sheets

METHOD OF FORMING AN ELECTRICAL FUSE AND A METAL GATE TRANSISTOR AND THE RELATED ELECTRICAL FUSE

BACKGROUND

1. Field of the Invention

The present invention relates to a method of forming an electrical fuse (e-fuse) and a metal gate transistor, and more particularly to a method of integrating an e-fuse process into a high dielectric constant (high-k) material and metal gate (HK/MG) process.

2. Description of Related Art

Electrical fuses (e-fuses) are generally applied to redundancy circuits in the integrated circuits. Once a defect is detected in the circuit, these e-fuses are used to trim or replace the defective part(s) of the circuit. In a conventional memory structure, some fuses are fabricated in the top metal layer. If some memory cells, word lines or lead wires fail, the fuses may be used to disconnect the failed parts, and some redundant memory cells, redundant word lines or redundant lead wires may replace the failed parts.

In addition, some fuse designs can even provide the programming function. For example, each transistor of a memory array may be connected to a metal wire in a wafer, and the metal wire may include a programmable connecting component. After the semiconductor chips are fabricated in the wafer, signals may be inputted into the semiconductor chips to specialize the standard chips into various kinds of product chips, so as to reduce the research and development cost, and also the fabricating cost. For inputting data into the programmable read only memory (PROM), a high voltage may be applied to the connecting wire to burnout the programmable connecting component, so an open circuit (off-state) may be formed, and a digital signal "1" is inputted. On other hand, the un-burned fuse is connected to the transistor to form an on-state and a digital signal "0" is inputted. The procedure of blowing a fuse by a high voltage is called a programming step. Once the fuse is programmed, the fuse is rendered a permanently open circuit. Through the programming step, the programmed fuse and the un-programmed fuse serve as digital bits to store data.

As illustrated in FIG. 1, the prior art fuse unit 10 includes a poly-silicon e-fuse 12 and a controlling component 14, for example, is transistor. A terminal of the controlling component 14 is electrically connected to the poly-silicon e-fuse 12, and another terminal of the controlling component 14 is electrically connected to the ground point GND. In a normal condition, the fuse unit 10 is only a redundant part of the integrated circuit, and is not in use. While a trimming step or a programming step is performed, a gate voltage Vg is applied to the gate of the controlling component 14, and the controlling component 14 is therefore turned on. At this time, current Ids flows from the operating voltage Vfs through the poly-silicon e-fuse 12 to the ground point GND, and cause an electron migration in the poly-silicon e-fuse 12. When the current Ids continuously passes the poly-silicon e-fuse 12, the poly-silicon material of the poly-silicon e-fuse 12 moves along the boundaries of the crystalline grains, toward the current flow direction, and cause an open circuit for trimming or programming.

However, along with a trend towards scaling down the device size, the poly-silicon e-fuse is problematic in terms of device scaling. It is because the step of burning the poly-silicon e-fuse usually causes a particle pollution to damage the adjacent components. In order to reduce the potential damage to the adjacent components, large pitches between the poly-silicon e-fuse structure and the adjacent components are necessary, which decrease the component density. In addition, a sufficient current is necessary to burnout the poly-silicon e-fuse. Thus, a great voltage needs to be provided for such a programming step. Nevertheless, the voltage provided in the integrated circuit gets correspondingly smaller as the integrated circuit is being scaled down. Accordingly, control of the operating voltage for an e-fuse gets harder, and application of the poly-silicon e-fuse is limited. The present programming scheme may be inoperable due to the intrinsic robustness of the poly-silicon material. In the case of a highly reliable or compact circuit system, an on-off ratio of 2 to 3 orders of magnitude may hinder this usage range and applicability.

In light of this, the poly-silicon e-fuse structure limits increase in the component density. It is still a challenge to provide an e-fuse structure for nano-scaled integrated circuit.

BRIEF SUMMARY

Therefore, the present invention is directed to a method of forming an e-fuse and a metal gate transistor including a HK/MG process, which may reduce or resolve the above-mentioned prior art problems.

An embodiment provides a method of forming an electrical fuse and a metal gate transistor. First, a substrate is provided. At least an electrical fuse region and at least an active region are defined in the substrate. Subsequently, dummy gate stacks are formed in both the active region and the electrical fuse region. Each dummy gate stack includes a gate dielectric layer, a first work function metal layer, and a poly-silicon layer. Next, a plurality of source/drain regions is formed in the substrate at opposite sides of the dummy gate stack in the active region. Subsequently, a first interlayer dielectric layer is formed in the active region and in the electrical fuse region. The first interlayer dielectric layer exposes the poly-silicon layer disposed in the active region and in the electrical fuse region. Thereafter, the poly-silicon layer is removed to form an opening in the active region, and an opening in the electrical fuse region. Afterwards, a second work function metal layer is formed to cover the bottom and sidewall of the opening in the active region. Thereafter, a metal conductive structure is formed to fill the openings and form a metal gate transistor and an electrical fuse.

The present invention is also directed to an electrical fuse structure. The electrical fuse includes a substrate, a gate dielectric layer disposed on the substrate, a metal conductive structure disposed on a surface of the gate dielectric layer, an interlayer dielectric layer disposed on the substrate, and at least a contact plug penetrating the interlayer dielectric layer and contacting a surface of the metal conductive structure.

Accordingly, the process proposed by the present invention may not only minimize the component size but also provide an e-fuse and a metal gate transistor for stable operations. The e-fuse process therefore may be integrated into 32/28 nanometers process effectively to increase the component density of integrated circuit.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Hereinafter, preferred embodiments of the present invention will be described in detail with reference to the accompanying drawings. Here, it is to be noted that the present invention is not limited thereto. Furthermore, the step serial numbers concerning the forming method are not meant thereto limit the operating sequence, and any rearrangement of the operating sequence for achieving same functionality is still within the spirit and scope of the invention.

Figure 1:
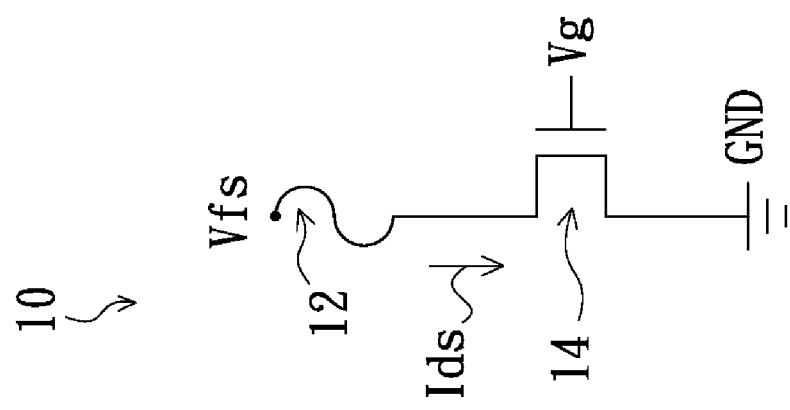
FIG. 1 is a schematic view of a conventional fuse unit.
Figure 2:
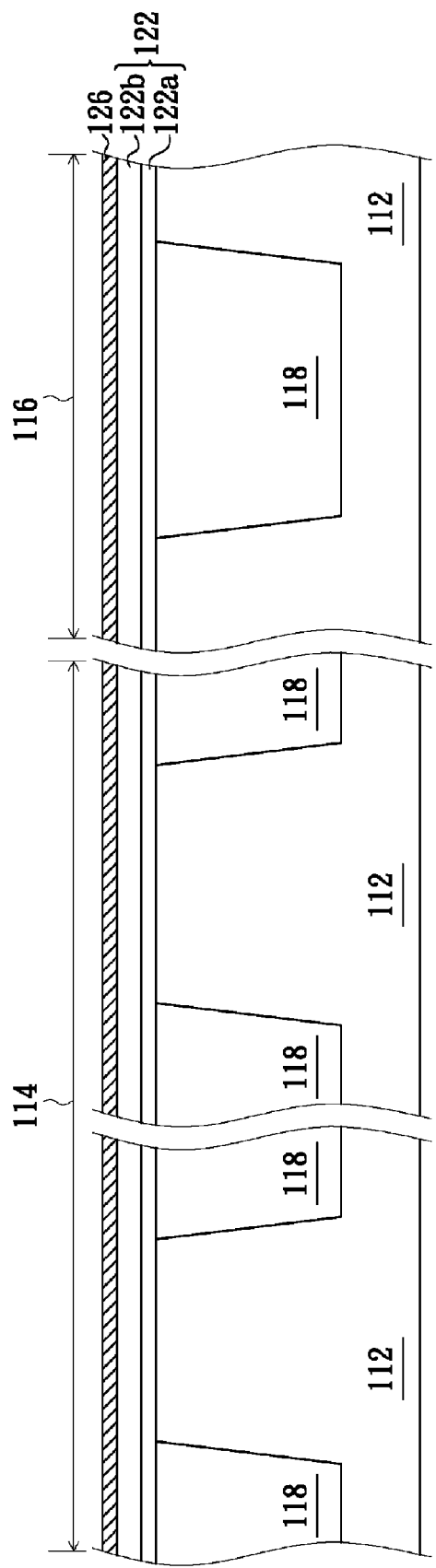
FIGS. 2-9 illustrate a method of forming an electrical fuse and a metal gate transistor according to an embodiment of the present invention.

Referring to FIG. 2 through FIG. 9, FIGS. 2-9 illustrate a method of forming an electrical fuse and a metal gate transistor according to an embodiment of the present invention. The like numbered numerals designate similar or the same parts, regions or elements. It is to be understood that the drawings are not drawn to scale and are served only for illustration purposes. As shown in FIG. 2, a substrate 112, such as a silicon substrate, a silicon-containing substrate, or a silicon-on-insulator (SOI) substrate, is provided. At least one active region 114 and at least one e-fuse region are defined in the substrate 112. The active region 114 is a region for forming active components, such as N-type metal oxide semiconductor (NMOS) transistors, P-type metal oxide semiconductor (PMOS) transistors, and/or complementary metal oxide semiconductor (CMOS) transistors. In the present embodiment, for example, both an NMOS transistor and a PMOS transistor are fabricated in the active region 114.

The e-fuse region 116 is a region defined for forming e-fuses. A plurality of isolation structures 118, such as field oxide layers or shallow trench isolation (STI) structures, are formed in the substrate 112 in both the active region 114 and the e-fuse region 116 by utilizing a local oxidation (LOCOS) process or a shallow trench isolation process. Some of the isolation structures 118 may surround and insulate the active component in the active region 114, and some of the isolation structures 118 may insulate the e-fuse structure in the e-fuse region 116.

Thereafter, a gate dielectric layer 122 is formed on the surface of the substrate 112 in both the active region 114 and the e-fuse region 116. In this embodiment, the gate dielectric layer 122 may include an oxide layer 122a disposed over the substrate 112, and a high-k material layer 122b disposed over the oxide layer 122a. The oxide layer 122a may be formed by a thermal oxidation process or a chemical vapor deposition (CVD) process, and may include at least one dielectric layer, such as a silicon dioxide layer or a silicon oxynitride layer. Afterwards, the high-k material layer 122b is formed over the oxide layer 122a in both the active region 114 and the e-fuse region 116, and may include HfSiO, HfSiON, HfO, LaO, LaAlO, ZrO, ZrSiO, HfZrO, or combination thereof. In other embodiments, the gate dielectric layer 122 may be a single layer structure or a multiple-layer structure that having material layers more than two, and any proper dielectric material may be included. In addition, an optional cap layer (not shown) may be formed on the gate dielectric layer 122 in other embodiments. For example, the cap layer including LaO, Dy2O3, or combination thereof may be deposited on the whole surface. Next, portions of the cap layer disposed in the PMOS transistor region are removed, and retaining the remainder portions of the cap layer disposed in the NMOS transistor region and the fuse region.

Still referring to FIG. 2, a process, such as a CVD process, a physical vapor deposition (PVD) process, an atomic layer deposition (ALD) process, a sputtering process or plasma enhanced chemical vapor deposition (PECVD) process, may be performed to form a first work function metal layer 126 over the gate dielectric layer 122. The first work function metal layer 126 may include an N-type work function metal or a P-type work function metal, and the first work function metal layer 126 may be a single layer structure or a multiple-layer structure.

Regarding a material selection for the first work function metal layer 126, the first work function metal layer 126 may include a material with a resistance lower than 100 μ-ohm-cm, such as pure metal, metal alloy, metal oxide, metal nitride, metal oxynitride, metal silicide, metal carbide or other metal compounds. In a case of forming both a NMOS transistor and a PMOS transistor, such as in a case of forming a CMOS transistor, the fermi level of the metal gate preferably approaches to the mid-gap of silicon material. Therefore, the critical voltage (Vth) of the NMOS transistor and the critical voltage of the PMOS transistor may be adjusted to correspond with each other. In addition, the material of the metal gate preferably has great steadiness under high-temperature, good blocking ability from impurities, and great adhesion in the present invention. Thus, the possibility of the material of the gate penetrating into the substrate or the dielectric layer due to pollution may be effectively reduced, and also the possibility of impurities from penetrating into the gate, and peeling effect may be effectively reduced. For example, the first work function metal layer 126 may preferably include titanium nitride (TiN), tantalum nitride (TaN), tantalum carbide (TaC) or tungsten nitride (WN).

Figure 3:
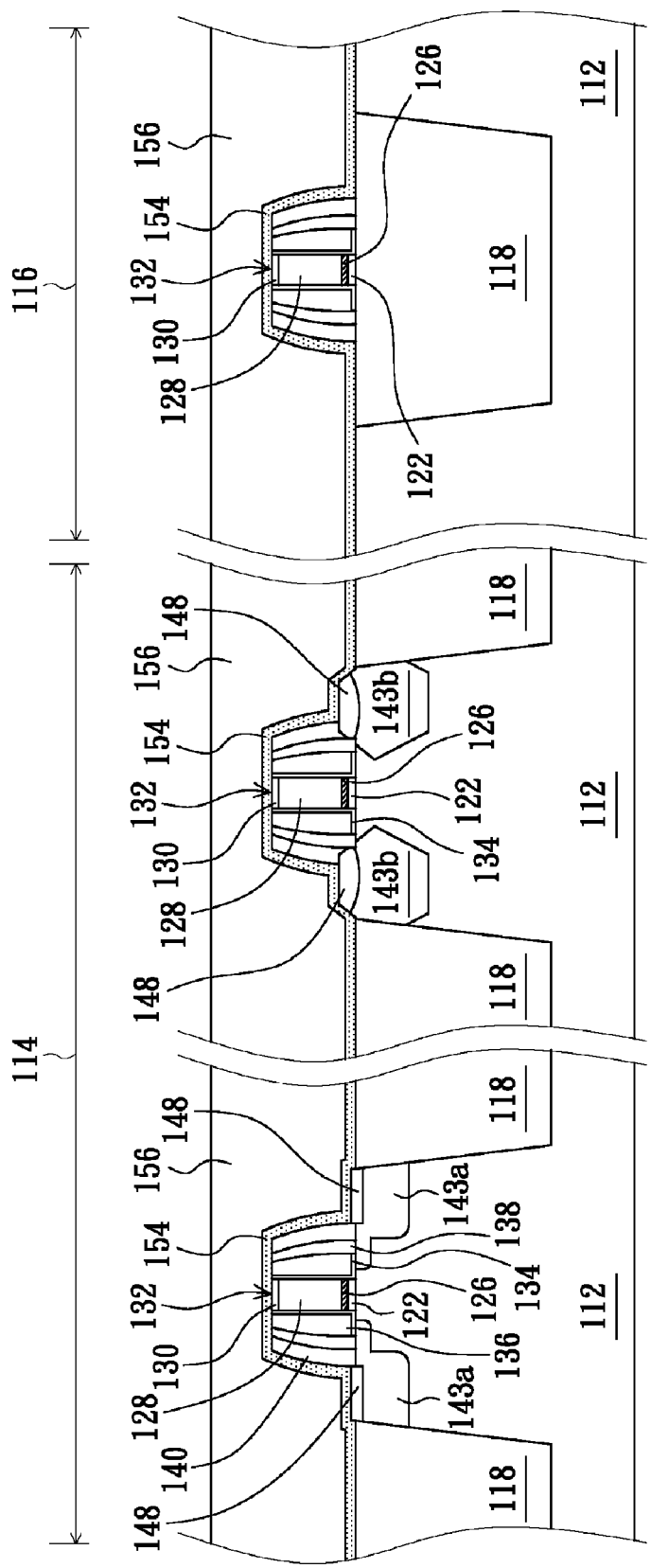

As shown in FIG. 3, a poly-silicon layer 128 and a mask layer 130 may be formed over the first work function metal layer 126, one or more etching step may be carried out on portions of the mask layer 130, portions of the poly-silicon layer 128, portions of the first work function metal layer 126 and portions of the gate dielectric layer 122 to form dummy gate stacks 132 for the NMOS transistor and the PMOS transistor respectively in the active region 114, and a dummy gate stack 132 for the e-fuse structure in the e-fuse region 116. In addition, offset spacers 134 may be formed on sidewalls of the dummy gate stack 132, lightly doping processes may optionally be formed in the active region 114, a plurality of spacers may optionally be formed on sidewalls of the dummy gate stack 132, N-type source/drain regions 143a may be formed, source/drain recesses for the PMOS transistor may optionally be formed, an selective epitaxial growth (SEG) process can be carried out on the substrate 112 to fill the source/drain recesses with SiGe as P-type source/drain regions 143b, and a salicide process may be performed in the active region 114 to form silicide 148 on both the N-type source/drain regions 143a and the P-type source/drain regions 143b. For instance, the spacer structures may include the silicon oxide layer 136, the silicon nitride cap layer 138 and the second silicon oxide layer 140. Next, an etching stop layer 154 are optionally formed to cover the surfaces of the substrate 112, the source/drain regions 143a, 143b, the dummy gate stacks 132 and the second silicon oxide layer 140. Subsequently, a first interlayer dielectric layer (IDL) 156 may be formed to over the etching stop layer 154.

It should be noted that, the above-mentioned step serial numbers are not meant thereto limit the operating sequence, and any rearrangement of the operating sequence for achieving same functionality may be accepted. For example, a silicon nitride cap layer 138 may be deposited to cover a first spacer made by the first silicon oxide layer 136. Thereafter, an etching-back process may be performed on the silicon nitride cap layer 138 to form a second spacer. Afterwards, other processes, such as forming the N-type source/drain regions 143a and forming the P-type source/drain regions 143b, may be carried out in turn. Furthermore, a second silicon oxide layer 140 may be deposited and etched-back to form a third spacer. In other embodiments, the P-type source/drain regions 143b may be formed before the N-type source/drain regions 143a are formed.

The poly-silicon layer 128 is used to serve as a sacrificial layer, and may include undoped poly-silicon, doped poly-silicon, amorphous silicon or other materials. The mask layer 130 may include silicon dioxide ($SiO_2$), silicon nitride (SiN), silicon carbide (SiC) or silicon oxynitride (SiON). In addition, the silicon nitride cap layer 138 can also optionally have tension stress, and is applied as a stressed cap layer. The etching stop layer 154 may be used as a stop layer in the subsequent planarization process and the contact plug process, and may include a silicon nitride layer. The etching stop layer 154 may have a thick silicon nitride layer in some embodiments to serve as a stress cap layer. The first interlayer dielectric layer 156 may include nitride, oxide, carbide, low electrical constant material or the combination thereof.

Figure 4:
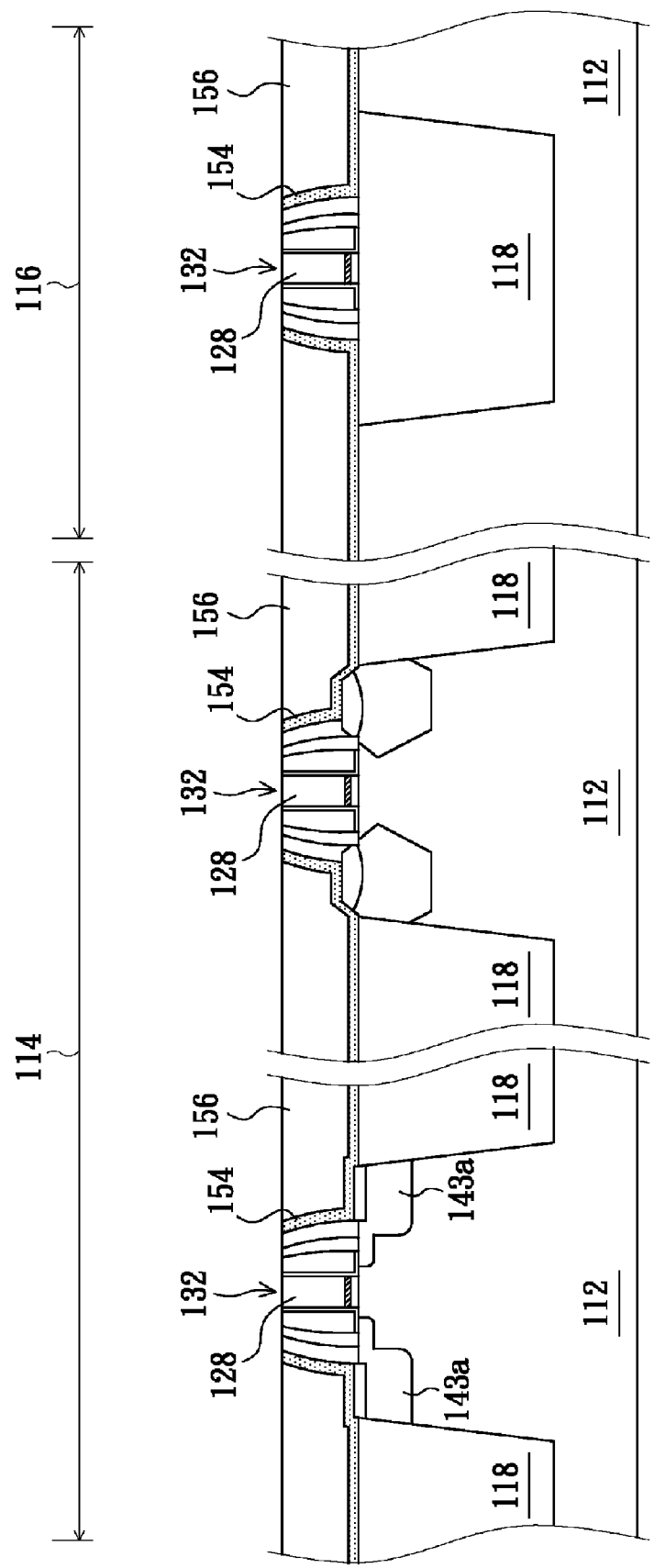

As shown in FIG. 4, a planarization process, such as a chemical mechanical polishing (CMP) process or a dry etching process, is performed over the first interlayer dielectric layer 156 to removed portions of the first interlayer dielectric layer 156, portions of the etching stop layer 154 and the mask layer 130, and thereby expose the poly-silicon layer 128, and top surface thereof may contour the surface of the first interlayer 156.

Figure 5:
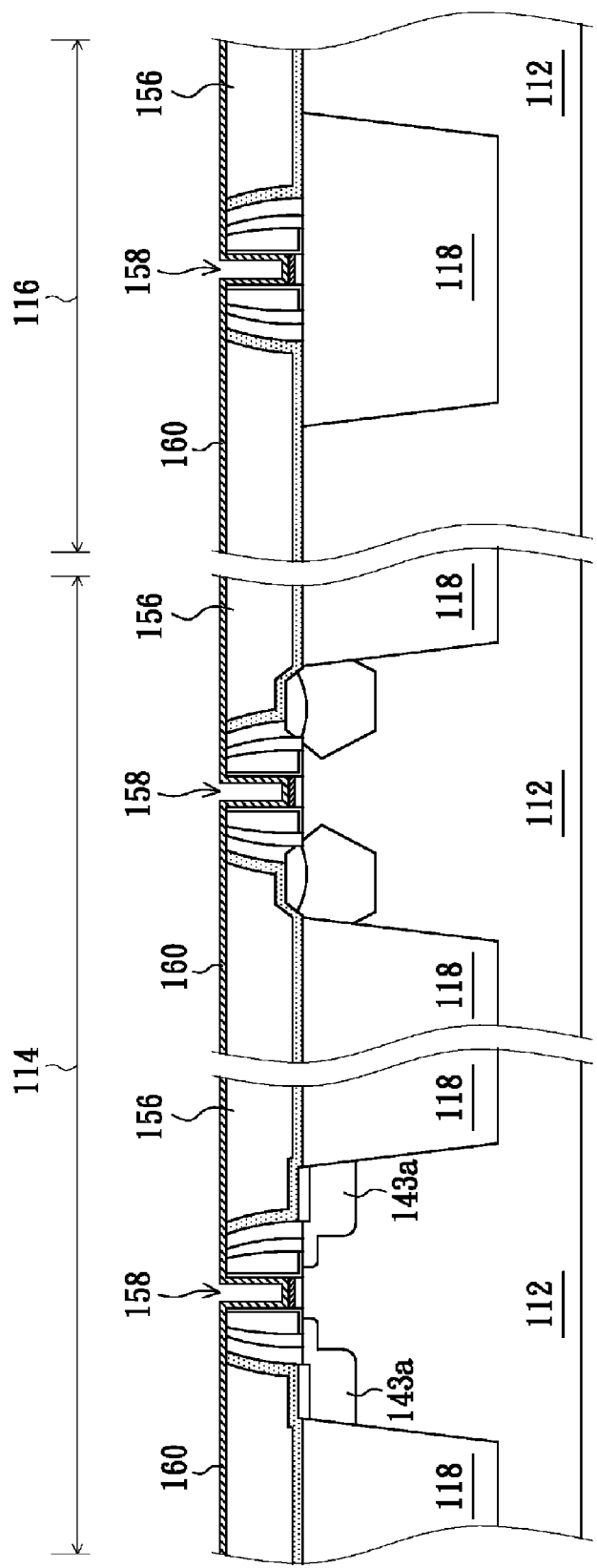

As shown in FIG. 5, a dry etching or a wet etching process may be optionally performed to remove the poly-silicon layer 128 in both the active region 114 and the e-fuse region 116, and the remainder first interlayer dielectric layer 156 is retained. For example, ammonium hydroxide (NH4 OH) or tetra-methyl ammonium hydroxide (TMAH) may be used to remove the poly-silicon layer 128. The first interlayer dielectric layer 156 may be slightly etched. Accordingly, three openings 158 are formed in the active region 114 and the e-fuse region 116, and the first work function metal layer 126 disposed under the openings 158 are exposed.

Figure 6:
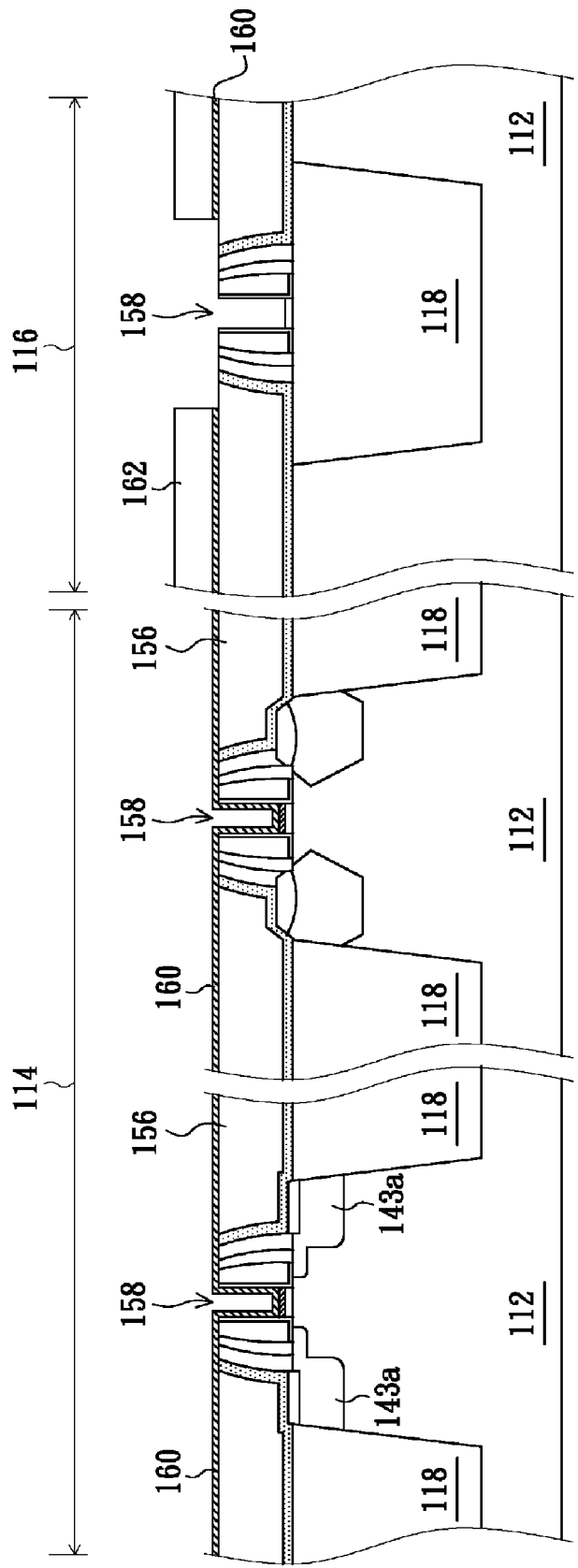

As shown in FIG. 6, a second work function metal layer 160 may be formed to cover bottom and sidewalls of each opening 158. Next, portions of the second work function metal layer 160 and portions of the first work function metal layer 126 disposed in e-fuse region 116 are removed. The first work function metal layer 126 may therefore only be disposed in the active region 114. Particularly, a CVD process, a PVD process, an ALD process, a sputtering process or a PECVD process may be first performed, for example, to form the second work function metal layer 160 including P-type work function metal or N-type work function metal. After that, a patterned photoresist 162 may be formed over the second work function metal layer 160 to expose the opening 158 in the e-fuse region 116. Next, a dry etching process or a wet etching process may be carried out to remove portions of the second work function metal layer 160 and portions of the first work function metal layer 126 disposed on the sidewalls and bottom of the opening 158 in the e-fuse region 116. Accordingly, the gate dielectric layer 122 disposed in the opening 158 of the e-fuse region 116 can be exposed.

The second work function metal layer 160 may be a single layer structure or a multiple-layer structure, and may preferably include TiN, TaN or WN. In addition, an ion implanting process or a surface treatment may be performed on the work function metal layer, the process recipes of the work function metal layer may be adjusted, the number of the work function metal may be increase or decrease in the present invention to provide proper work function value or other needed characteristics for different types of transistors.

Figure 7:
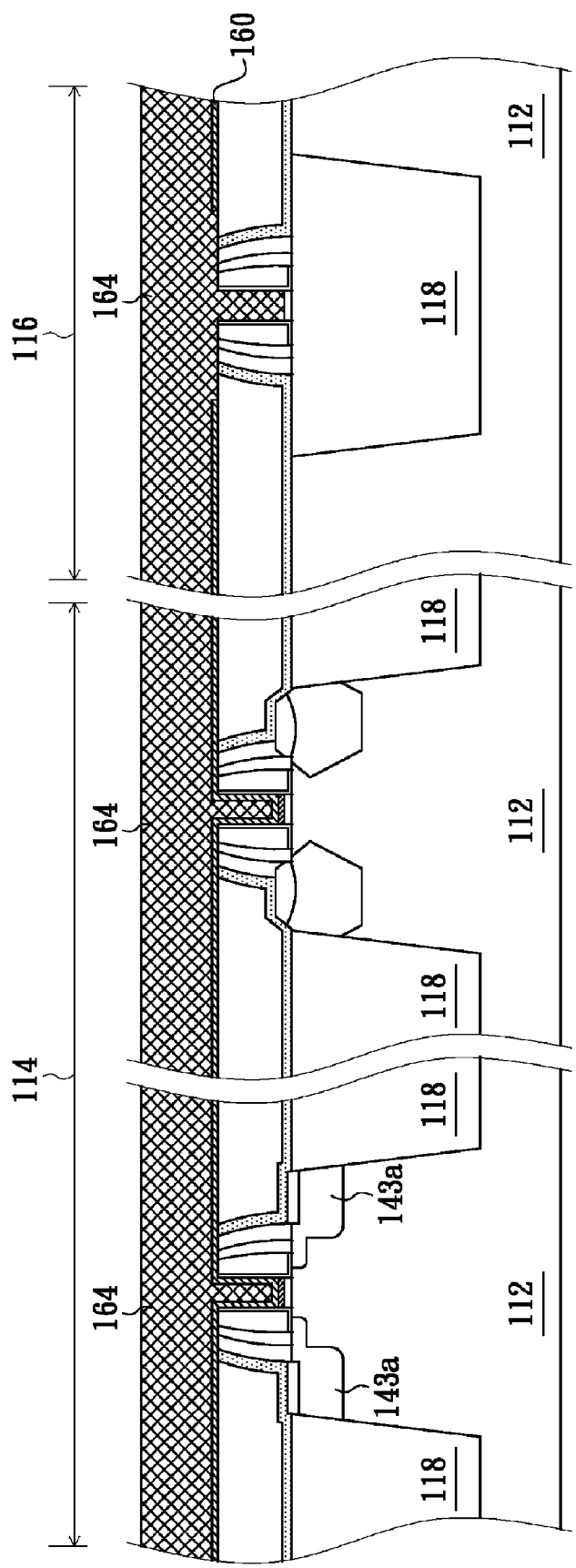

As shown in FIG. 7, a conductive layer 164 mainly comprising of low-resistance material, such as metal, is thereafter formed to cover the second work function layer 160 in the active region 114, and fill the openings 158. The conductive layer 164 may directly contact the gate dielectric layer 122 in the opening 158 of the e-fuse region 116. The conductive layer 164 in this embodiment may include low resistance materials, such as aluminum, tungsten, titanium aluminum alloy (TiAl) or cobalt tungsten phosphide (CoWP).

Figure 8:
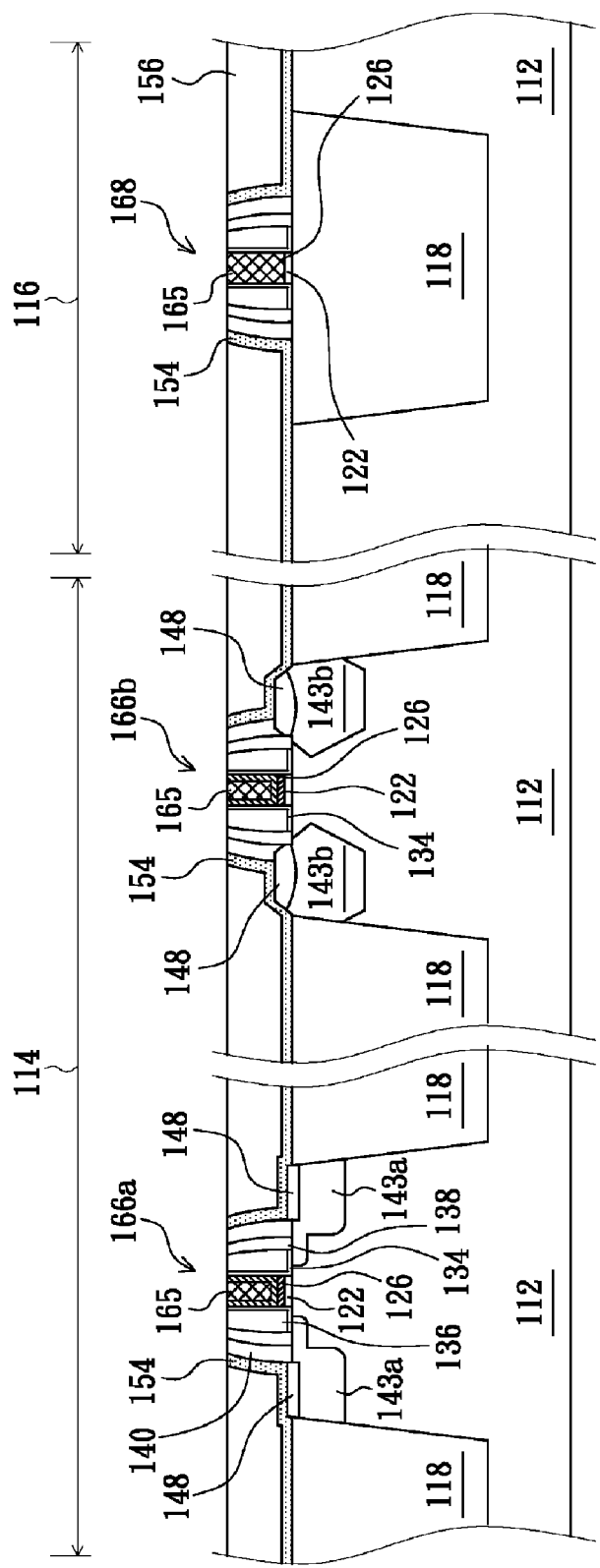

As shown in FIG. 8, another chemical mechanical polishing process is performed to remove portions of the conductive layer 164, and form a plurality of metal conductive structures 165. Each metal conductive structure 165 is disposed in one opening 158. Thus, an e-fuse 168, a MOS transistor 166a having a metal gate, and a MOS transistors 166b having a metal gate are formed. The metal conductive structures 165 replace the dummy gate stacks 132, and are disposed on the gate dielectric layer 122. The spacer structures are disposed on the sidewalls of the metal conductive structures 165.

Figure 9:
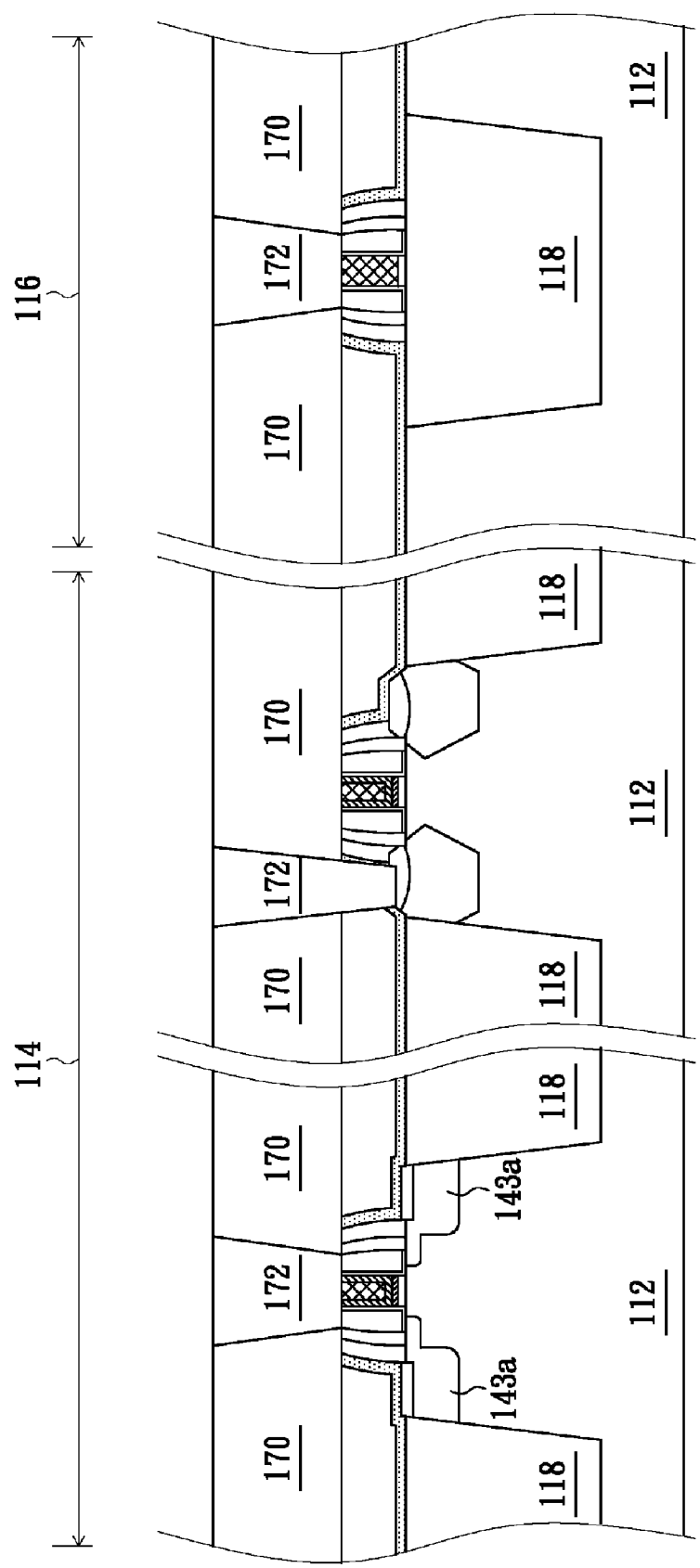

As shown in FIG. 9, a second interlayer dielectric layer 170 may be furthermore formed in both the active region 114 and the e-fuse region 116 to cover the first interlayer dielectric layer 156, the MOS transistor 166a, the MOS transistor 166b and the e-fuse 168. Next, a plurality of contact plugs 172 may be formed in the first and the second interlayer dielectric layers 156, 170. The contact plugs 172 are electrically connected to the metal conductive structures 165 of the MOS transistors 166a, 166b, the N-type source/drain region 143a, the P-type source/drain region 143b and the e-fuse 168 respectively.

To sum up, the aforementioned process may integrate the e-fuse process into the HK/MG process, and particularly into the 32/28 nanometers process effectively. Thus, not only the fabrication process is simplified but also provides a smaller size e-fuses and metal gate transistors. The redundancy circuits and the programming circuits may be minimized, and the component density of integrated circuit may be increased.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. An integrated device, comprising:
a substrate comprising a fuse region and a transistor region;
a gate dielectric layer disposed over the substrate in the transistor region and the fuse region;
a metal conductive structure disposed over the gate dielectric layer in the transistor region and the fuse region;
a U-shaped work function metal layer disposed between portions of the gate dielectric layer and the metal conductive structure where are only located in the transistor region;
an interlayer dielectric layer disposed over the substrate; and
at least a contact plug penetrating the interlayer dielectric layer and contacting a surface of the metal conductive structure.

2. The integrated device of claim 1, wherein the substrate comprises at least an isolation structure, and portions of the gate dielectric layer and the metal conductive structure located in the fuse region are disposed over the isolation structure.

3. The integrated device of claim 1, wherein the gate dielectric layer comprises an oxide layer and a high dielectric constant (high-k) material layer.

4. The integrated device of claim 1, wherein the metal conductive structure comprises aluminum metal.

5. The integrated device of claim 1, further comprising: a spacer structure disposed on the sidewall of the metal conductive structure.

6. The integrated device of claim 5, wherein the spacer structure comprises:
   a first oxide layer covering sidewalls of the metal conductive structure;
   a nitride cap layer covering sidewalls of the first oxide layer; and
   a second oxide layer covering sidewalls of the nitride cap layer.

7. The integrated device of claim 1, further comprising an etching stop layer covering the substrate and the metal conductive structure.

* * * * *